(12) United States Patent
Schumacher

(10) Patent No.: US 7,625,214 B2
(45) Date of Patent: Dec. 1, 2009

(54) HIGH DENSITY POWER CONNECTOR WITH IMPEDANCE CONTROL

(75) Inventor: Richard Schumacher, Dallas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 166 days.

(21) Appl. No.: 11/231,950

(22) Filed: Sep. 21, 2005

(65) Prior Publication Data

US 2007/0064402 A1    Mar. 22, 2007

(51) Int. Cl.
*H01R 12/00* (2006.01)
*H05R 1/00* (2006.01)

(52) U.S. Cl. .................. 439/61; 361/752; 174/262
(58) Field of Classification Search .............. 439/61; 174/262; 324/754; 361/752

See application file for complete search history.

(56) References Cited

U.S. PATENT DOCUMENTS

| | | | | |
|---|---|---|---|---|
| 4,838,798 A | * | 6/1989 | Evans et al. | 439/61 |
| 5,167,511 A | * | 12/1992 | Krajewski et al. | 439/61 |
| 2004/0085081 A1 | * | 5/2004 | Logelin et al. | 324/754 |
| 2006/0042831 A1 | * | 3/2006 | Rohde et al. | 174/262 |

* cited by examiner

*Primary Examiner*—Dean A. Reichard
*Assistant Examiner*—Andargie M Aychillhum

(57) ABSTRACT

A power connector assembly is provided that has high power density capability and controllable impedance. One embodiment has a multi-layer stack of printed circuit boards that each contain one or more metal layers that function selectively as power and return planes. The metal layers are electrically in contact with contact arrays of connectors, such as through half vias or slot vias for example, which mate with corresponding contact arrays of connectors associated with the circuits being connected together. Discrete components may be used to further control impedance of the connector. Different connector technologies may be used for connecting contacts to the metal layers.

17 Claims, 5 Drawing Sheets

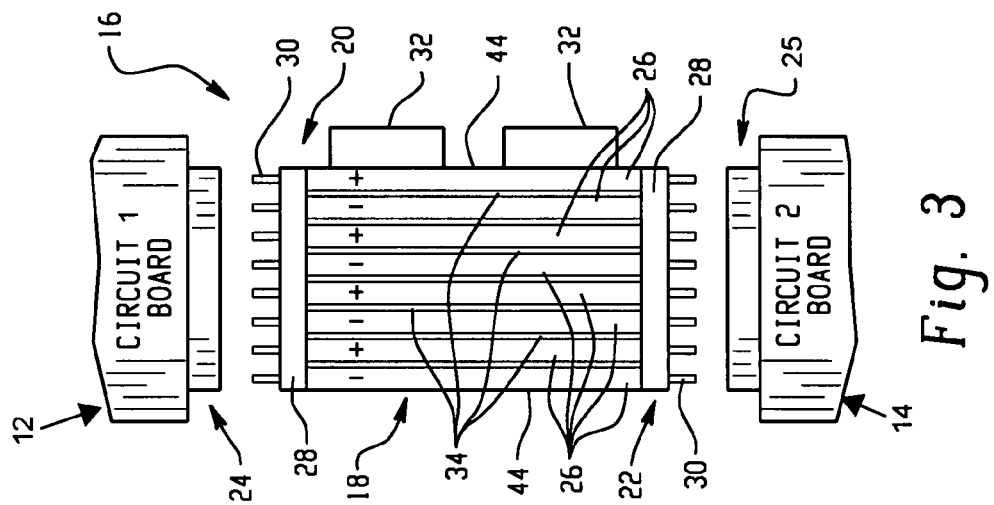
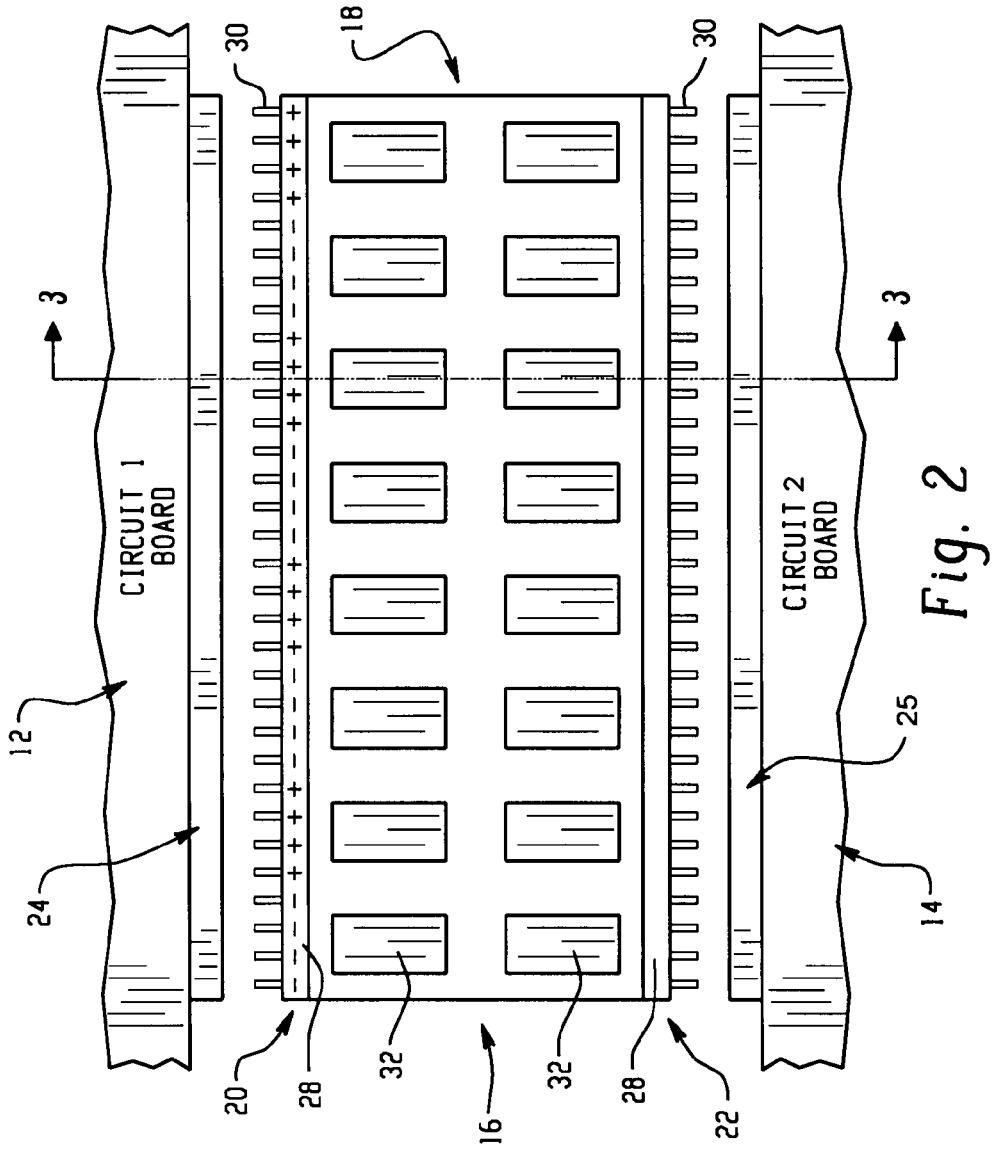

HIGH DENSITY POWER CONNECTOR WITH IMPEDANCE CONTROL

SUMMARY OF THE INVENTION

The invention relates generally to power connectors used to couple power between electrical circuits. More particularly, the invention provides a power connector assembly having high power density and that may include impedance control.

BACKGROUND OF THE INVENTION

Most electrical systems including electronic computing and control systems, utilize circuits that are mounted on boards called printed circuit boards or PCBs. Oftentimes due to either space limitations or other design criteria the electrical power used by a PCB is generated or sourced from a power supply or other circuit that is separate from the PCB. A power connector is commonly used to supply power to the PCB and includes a series of pins that plug into mating sockets to form an electrical connection with the PCB and another set of pins that plug into mating sockets on the power supply or source. Power is typically provided in the form of one or more power rails and one or more return or ground rails. Within an electrical system there may be multiple power grids, either due to the need to electrically isolate some circuits from one another or simply the fact that different electrical components may require different power supplies such as different voltage levels and current capacities.

Known power connectors however have significant design limitations, including poorly controlled or relatively high impedance, low power density and limited design flexibility so that to increase the size of a connector involves costly retooling. The inability to control the impedance of a power connector oftentimes produces unwanted noise coupling.

SUMMARY OF THE INVENTION

The invention contemplates a power connector assembly and methods for making the same, as well as an electrical system that incorporates one or more such power connectors. In accordance with one aspect of the invention, a power connector assembly (also referred to herein as a "PCA") provides for high power density capability and ease of construction so that the power density and other operational criteria of the power connector assembly can be modified without expensive tooling changes or re-design. In one embodiment, a PCA includes one or more subassemblies that are assembled in a parallel stacked arrangement. Power density, for example, can be increased by simply adding more subassemblies to the stack. Connectors are used to make electrical contact with the power and return grids that are within the subassembly stack. The invention allows for different contact array techniques as required.

The invention further contemplates a PCA with high power density capability and controlled impedance capability. In one embodiment, a PCA includes one or more subassemblies that are assembled in a parallel stacked arrangement. The power and ground or return planes may be arranged to achieve the desired impedance characteristics such as making the impedance a desired function of frequency, and the subassemblies may further include discrete components such as capacitors to adjust the impedance. The discrete components may be mounted on the exterior surfaces of the stacked subassemblies, and may also be mounted within and between the stacked subassemblies. The power and return planes may be provided in the form of interior metal layers within a subassembly, exterior metal surface layers on a subassembly or both. Multiple power and return planes may be disposed on one or more of the subassemblies. Insulating layers may be used as required between the stacked subassemblies to prevent electrical short circuits or as an additional way to control the impedance. In a specific embodiment of the invention, each subassembly may be realized in the form of a planar printed circuit board (PCB).

The invention further contemplates methods for making a PCA. In accordance with one aspect of the invention, a PCA is made by providing one or more subassemblies that are arranged in a parallel stack. Current density and impedance may be controlled by selection of the thickness of various insulating layers, the use of discrete components and the number of subassemblies, as well as the layout of the power and return planes. The PCA is completed by including connectors so as to be able to connect the PCA to other circuits. In accordance with another aspect of the invention, contact arrays are connected to the PCA subassemblies using half vias or slot vias that may be opened by a cutting operation.

The invention further contemplates an electrical connector for a circuit board and a method for making such an electrical connection. In one embodiment, the electrical connection includes a half via or slot via that is in electrical connection with a circuit on the circuit board and to which an electrical contact is connected.

These and other aspects and advantages of the present invention will be readily appreciated and understood from the following detailed description of the invention in view of the accompanying drawings.

BRIEF DESCRIPTION OF THE DRAWINGS

FIG. 2 is a plan view of a power connector assembly in accordance with the invention;

FIG. 3 is a cross-section view of the device of FIG. 2 taken along the line 3-3;

DESCRIPTION OF THE EXEMPLARY EMBODIMENTS

Figure 1:
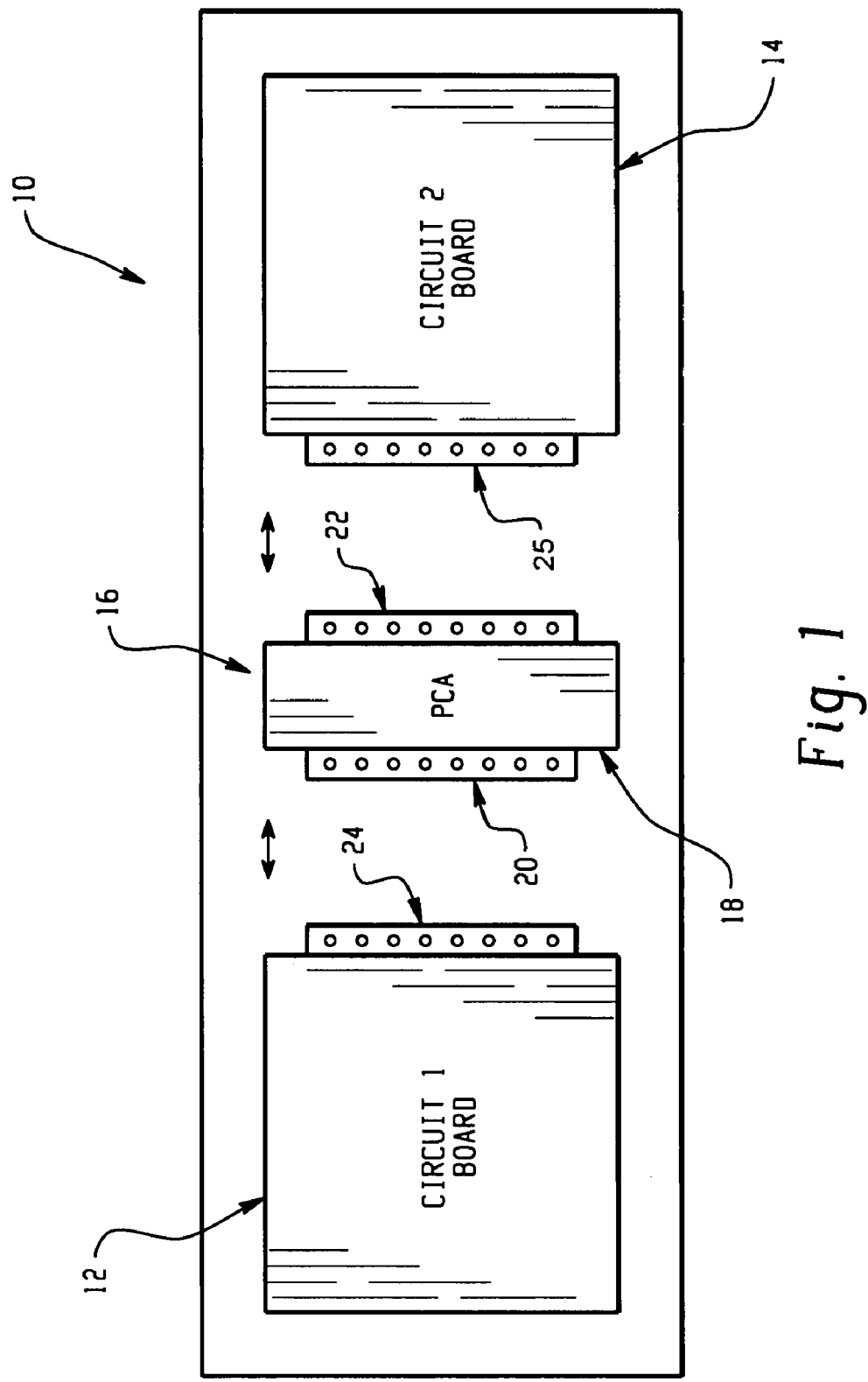
FIG. 1 is functional block diagram of a system using an embodiment of the invention.

With reference to FIG. 1, the reference numeral 10 designates generally an electrical apparatus or system. The system 10 may be any electrical or electronic apparatus, for example but not limited to, a computer, a server, test equipment and so on. The apparatus 10 includes a first circuit 12, a second circuit 14 and a power connector assembly (PCA) 16. The circuits 12 and 14 may be of any circuit design, sub-circuits, controllers or components of larger circuits in which it is necessary to connect power or share power between the two circuits 12, 14. For example but not by way of limitation, the first circuit 12 may be any electrical or electronic circuit, such as for example but not by way of limitation, a logic circuit, perhaps a digital or analog circuit or a combination thereof, and the second circuit 14 may be a power supply that provides all or part of the current and voltage requirements for the first circuit 12. The second circuit 14 may also be another electrical or electronic circuit that simply is used to source power to the first circuit such as a basic parallel or serial connection of shared power supplies. Sometimes, a particular circuit 12 is mounted on a printed circuit board (PCB) or other base structure and there is insufficient room to mount a power supply; or perhaps it is desired by design to keep the power supply on a separate PCB to reduce noise coupling and other deleterious effects such as heat. The apparatus 10 may use one or more PCA arrangements for a wide variety of power connection requirements. Each PCA 16 may be unique in design or capacity or they may all be the same within a single apparatus 10 or there may be a mixture of designs depending on the power connection requirements within the apparatus 10. The number of different applications for use of the present invention is thus as wide and varied as the number of electrical systems in use throughout commerce.

While various aspects of the invention are described and illustrated herein as embodied in combination in the exemplary embodiments, these various aspects may be realized in many alternative embodiments, either individually or in various combinations and sub-combinations thereof. Still further, various alternative embodiments as to the various aspects and features of the invention, such as alternative materials, structures, configurations, methods, devices, software, hardware, control logic and so on may be described herein, but such descriptions are not intended to be a complete or exhaustive list of available alternative embodiments, whether presently known or later developed. Those skilled in the art may readily adopt one or more of the aspects, functions, concepts or features of the invention into additional embodiments within the scope of the present invention even if such embodiments are not expressly disclosed herein. Additionally, even though some features, concepts or aspects of the invention may be described herein as being a preferred arrangement or method, such description is not intended to suggest that such feature is required or necessary unless expressly so stated. Still further, exemplary or representative values and ranges may be included to assist in understanding the present invention however, such values and ranges are not to be construed in a limiting sense and are only intended to be critical values if so expressly stated.

In the embodiment of FIG. 1, the PCA 16 includes a multilayer power connection assembly 18 and first and second contact array connectors 20, 22 arranged along respective edges of the assembly 18. Each of the connectors 20, 22 may be a multi-level component having a multi-pin, multi-socket or multi-contact array, as will be apparent herein after, or may be as simple as only two pins, sockets or contacts on a single level. In the exemplary embodiment herein the PCA 16 is an eight level assembly of eight subassemblies with a corresponding number of rows of contacts associated with the connectors 20, 22, but these are merely examples. The number of contacts, sockets, pins, connectors, subassemblies and so on will be determined by the power density requirements for the connection between circuit 1 and circuit 2, as well as the impedance requirements for that connection. As another example of an alternative embodiment, a PCA 16 may be designed that has only a single connector because the PCA 16 may be part of the power supply. It should also be noted that although the exemplary embodiments herein illustrate the connectors 20, 22 as being positioned along the edges of the assembly 18, such is not required and the connectors 20, 22 may be positioned in any manner so as to make the needed electrical connection to the power and return planes as will be described herein after.

The type of contact array connector 20, 22 used with the invention may be selected from a wide number of available technologies, although embodiments of a type of connector using half vias or slot vias is disclosed herein as one aspect of the invention. Such connector types may include but are not limited to edge connectors, straddle-mount, right-angle through hole and so forth.

Still further, while the exemplary embodiments herein illustrate the use of two end connectors located on opposite sides of the PCA 16, those skilled in the art will readily appreciate that the connectors 20, 22 may be arranged in any convenient manner, including but not limited to having all the connectors 20, 22 on a common side or surface of the PCA 16.

Each circuit 12, 14 also includes a contact array connector 24 and 25 respectively that mate respectively with the connectors 20, 22 of the PCA 16. The various connectors 20, 22, 24 and 25 typically will be mating male and female connector designs such as pin and socket, but the present invention is not limited to any specific class or type of connector technology.

With reference to FIGS. 2 and 3, in this embodiment of the PCA 16, the PCA includes a plurality of subassemblies 26, arranged one on top of the other in a parallel stacked configuration. In this example, there are eight subassemblies 26, but the number may be selected based on the overall performance requirements of the power connector 16, particularly the power density needed, footprint size and impedance control requirements. A PCA in accordance with one embodiment of the invention may use as few as a single subassembly 26, since each subassembly can accommodate multiple layers within the subassembly. In some cases a single layer subassembly may be used since multiple power and ground planes can be laid out as needed on the surfaces of the subassembly. Also shown in FIGS. 2 and 3 in partial view are the mating connectors 24 and 25 for the first and second circuits 12, 14 respectively. These connectors 24, 25 mate with the PCA connectors 20 and 22, although it is not required that each and every pin on the PCA connectors 20, 22 mate with a socket on the circuits 1 and 2. In many designs there can be unused or unconnected pins, although for the PCA herein the purpose of the pins is to among other things increase current density so typically they all will be used but such is not a requirement.

For each subassembly 26, there is provided a connector body 28 and a row of contacts 30 in a single row array. The number of contacts 30 again will depend on the power density needed and other design factors as required, such as the packing density of the pins and sockets and so on. Thus in a typical, but not required, assembly 16 there will be an N×M array of contacts 30 for each connector 20, 22, where N is the number of subassemblies and M is the number of contacts per subassembly. In the example of FIGS. 2 and 3 the PCA 16 is an 8×32 array. It is not necessary that each subassembly include the exact same number of contacts 30 as the other assemblies within a single PCA.

Each subassembly 26 may be realized in the form of a printed circuit board (PCB), also sometimes referred to as a 'card', however other structures may be appropriate for different applications. As used herein, PCB is a reference to any the well known or later developed circuit board technologies which, typically, and by way of illustration and not of restriction, include one or more layers of dielectric materials such as glass and epoxy resin and one or more layers of conductive materials such as copper, which are laminated together and used as a substrate or base for electrical components and conductors. A typical PCB is a multi-layer component in and of itself. In the context of a power connector assembly 16, the PCBs 26 will primarily have metal layers that function as power and reference or ground planes to accommodate voltage and current to the extend needed to achieve the desired power density of the PCA 16. These metal layers may be disposed on the surface of the PCB, within the layers of the PCB or both. Moreover, discrete components such as capacitors, inductors and resistors, or active components for example may be used and configured as a network or circuit to make the impedance of that power circuit a desired function of frequency. Still further the layout itself of the conductive layers, as well as the use of multiple conductive layers on various surfaces or layers of the PCBs may be used to determine the desired impedance characteristic of the power circuit. In the example of FIGS. 2 and 3, discrete components 32 are disposed on the upper most exposed surface of one of the subassemblies 26, however, such components may also or alternatively be disposed on the opposite exposed surface or between the sandwiched subassemblies 26.

Depending on the layout of the metal layers, and the location of the discrete components 32, as well as to further assist in controlling the impedance of the PCA 16, insulator layers 34 may be used between the subassemblies 26. A typical insulator may be air or any desired and suitable solid dielectric material such as KAPTON™, glass-epoxy resin laminates, TEFLON™, and so forth, as are appropriate for the final application. A suitable epoxy or adhesive may be used to fully assemble the subassemblies 26, insulator layers 34 when used and the connectors 20, 22 into a single integral unit.

Typical PCB boards are commonly up to about one-eighth inch thick so that an eight level PCA 16 would be about one inch thick. The number of levels may be selected depending on height limitations for the PCA 16 within the apparatus 10, as well as any footprint limitations, since overall area of the metal planes will determine in large measure the power density of a particular PCA 16. Height adjustments can further be made by selecting different layouts of the circuit board or boards, including but not limited to layout of the one or more power and return conductive layers, discrete components, contact arrays and so on.

It should also be noted at this time that each subassembly 26 may include a single or plural metal layers which may be electrically used for a single power rail, single reference rail, or multiple power rails and even multiple reference rails as dictated by the design of the apparatus 10, and in particular the power connection requirements between the first and second circuits. Thus the M number of contacts 30 associated with each subassembly may in practice be all electrically in common with each other, or may selectively be assigned and electrically connected to specific power and return planes on the subassembly 26.

Figure 4:
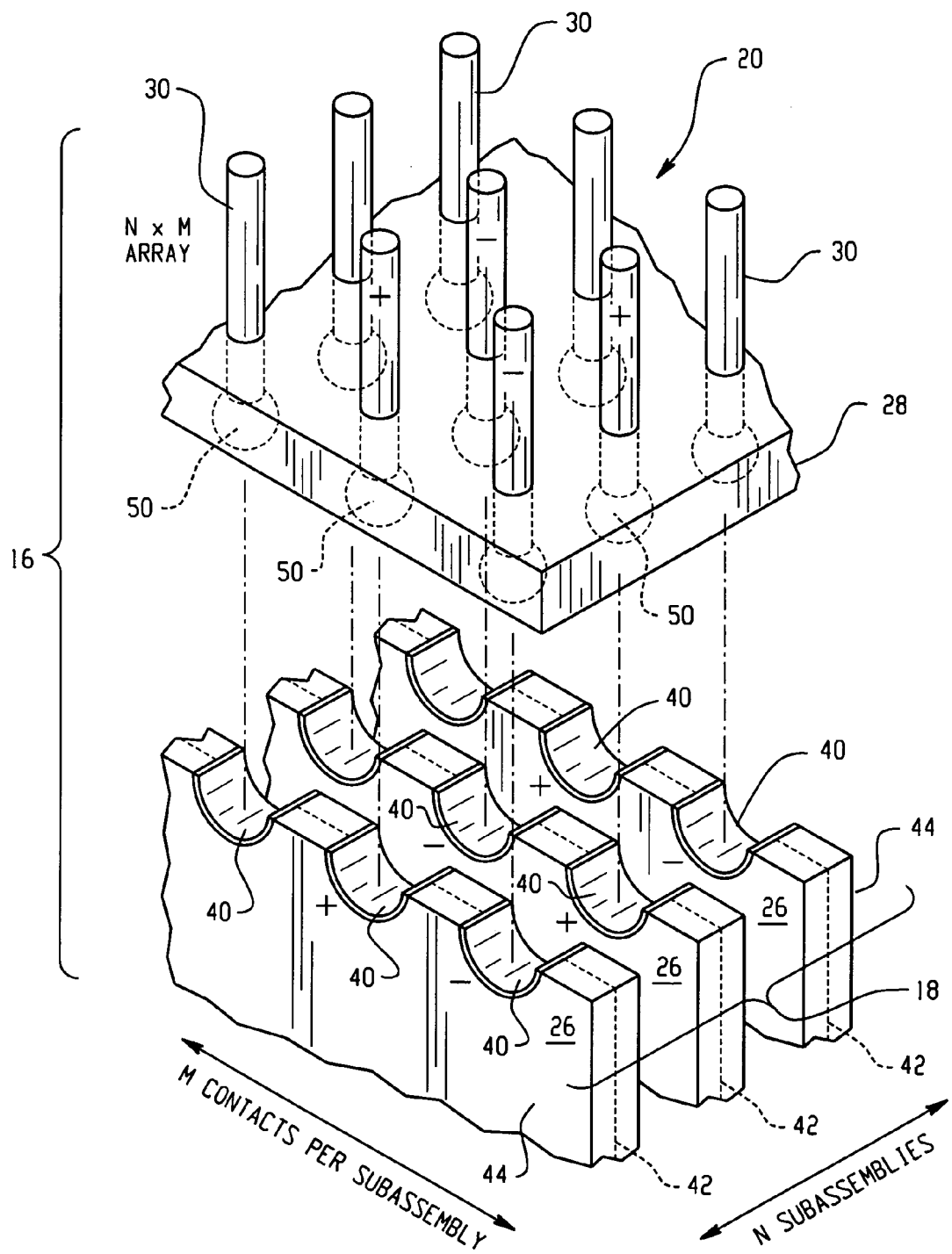
FIG. 4 is an exploded perspective of an edge portion of a PCA in accordance with the invention.
Figure 5:
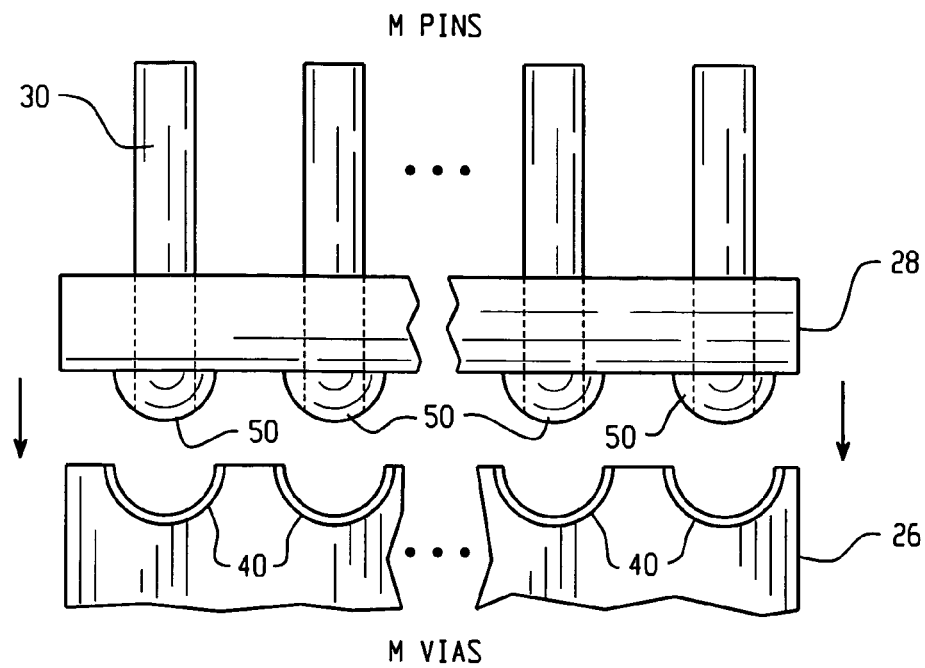
FIG. 5 is an exploded plan view of a subassembly and edge connection technique.

With reference to FIGS. 4 and 5, as well as FIGS. 2 and 3, an exemplary embodiment is illustrated for how to electrically connect a connector 20, 22 to one side of the PCA 16. In this example, when the subassemblies 26 are made, they include half vias 40, such as for example, plated through holes. These vias 40 are electrically connected to a respective and selectable metal layers 42 used for a power or reference plane, represented by a dashed line in FIG. 4 because the metal layers 42 may be embedded within the subassembly 26, but alternatively may be disposed on a surface 44 of the subassembly 26 or both. The geometric layout of the metal layers 42 will determine the current capacity especially, the overall power density of the PCA 16 and to some extent the impedance. The metal layers 42 in FIG. 4 are only illustrated schematically and should not be construed as only using single layers of conductive material per surface. Each surface, whether an interior or exterior surface, may comprise one or more discrete plans or conductive layers or patterns, wherein different conductive planes may be connected to different ones or a plurality of different contact arrays.

For example, for the eight subassemblies in FIG. 3, the power and return planes may alternate as represented by the + and − symbols. When multiple power and/or reference planes are used on a single subassembly, again they may be alternated as represented in FIG. 2. FIG. 4 shows another embodiment in which overlapping areas are opposite in polarity thus giving a checkerboard configuration. Such options and many others may be used by the designer particularly for controlling the impedance of the PCA 16.

Figure 6:
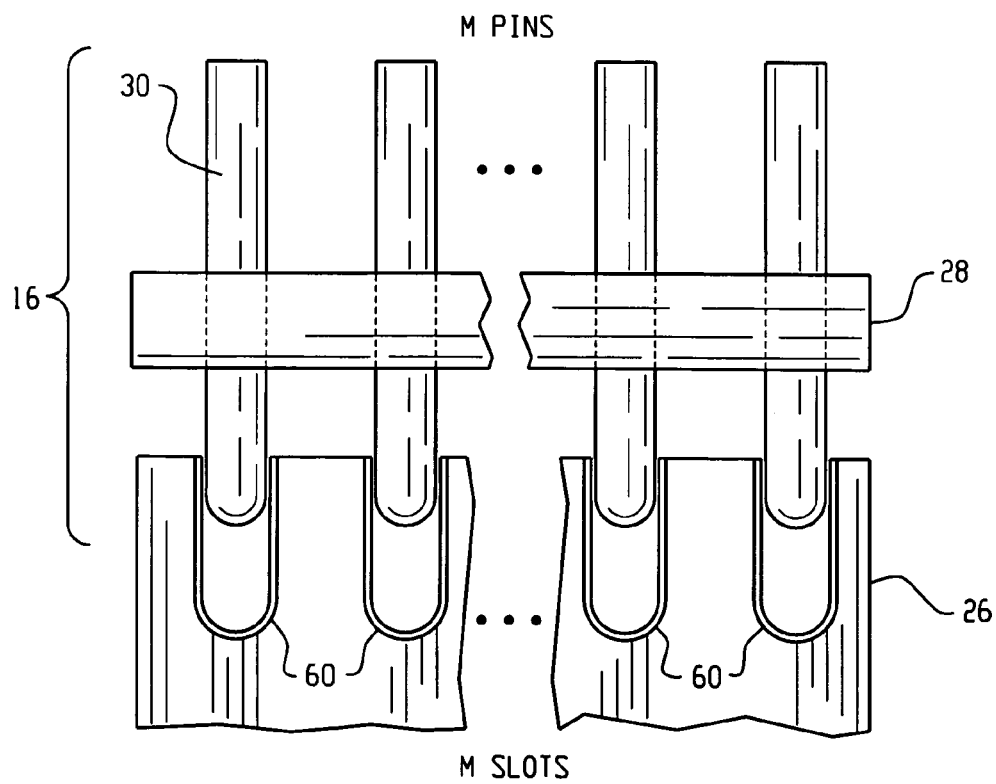
FIG. 6 is an exploded plan view of a subassembly and an alternative edge connection technique.

In the exemplary embodiment of FIGS. 4 and 5, the contact array is realized in the form of pins 30 each having an associated solder ball 50 that forms an electrical connection between the pin 30 and its associated plated half via 40. The pins 30 and solder balls 50 are initially retained in the connector body 28. After the solder is heated to create the electrical and mechanical connection between the pins and the half vias, the connector is rigidly attached to the assembly 18. Additional adhesive, epoxy or other mechanical reinforcement may be used as required. The aforementioned technique is known generally as a BGA mount although BGA mounts are not known by the inventor to have been used with half vias prior to the present invention. FIG. 6 illustrates an alternative embodiment wherein each subassembly 26 is made with plated slot vias 60 that receive corresponding pins 30. The pins may be soldered for example to the vias. Again, the connector body 28 may be adhesively or otherwise attached to the assembly 18 for additional mechanical strength as needed.

Figure 7A:
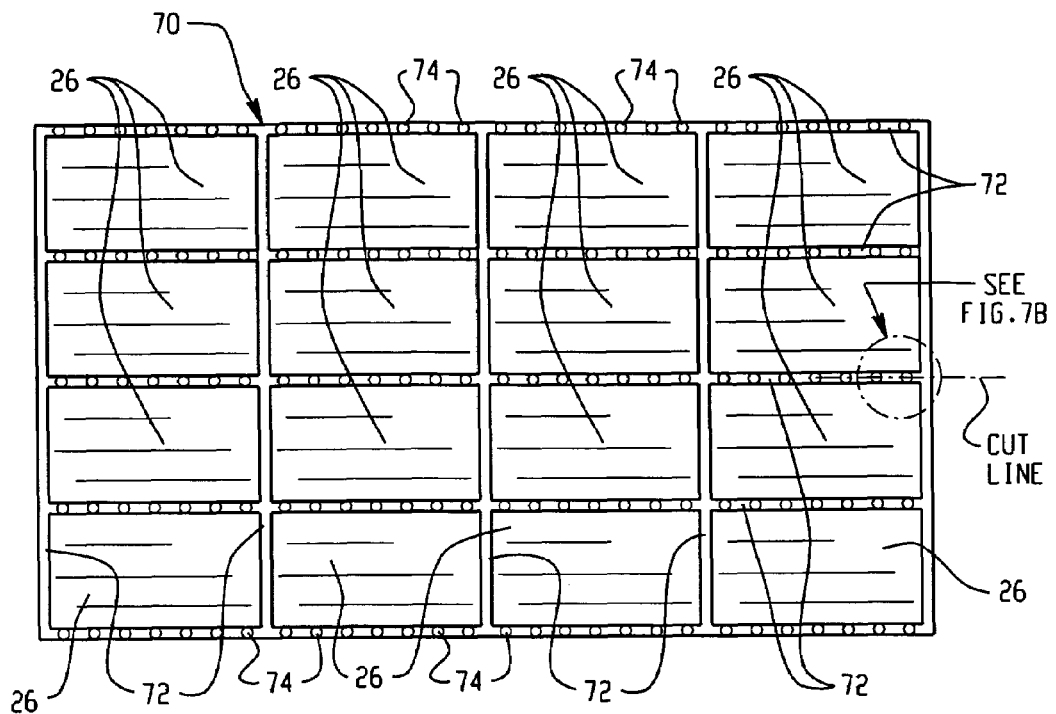
FIGS. 7A and 7B are plan views of a multiple subassembly panel suitable for one method of making subassemblies in accordance with the invention.
Figure 7B:
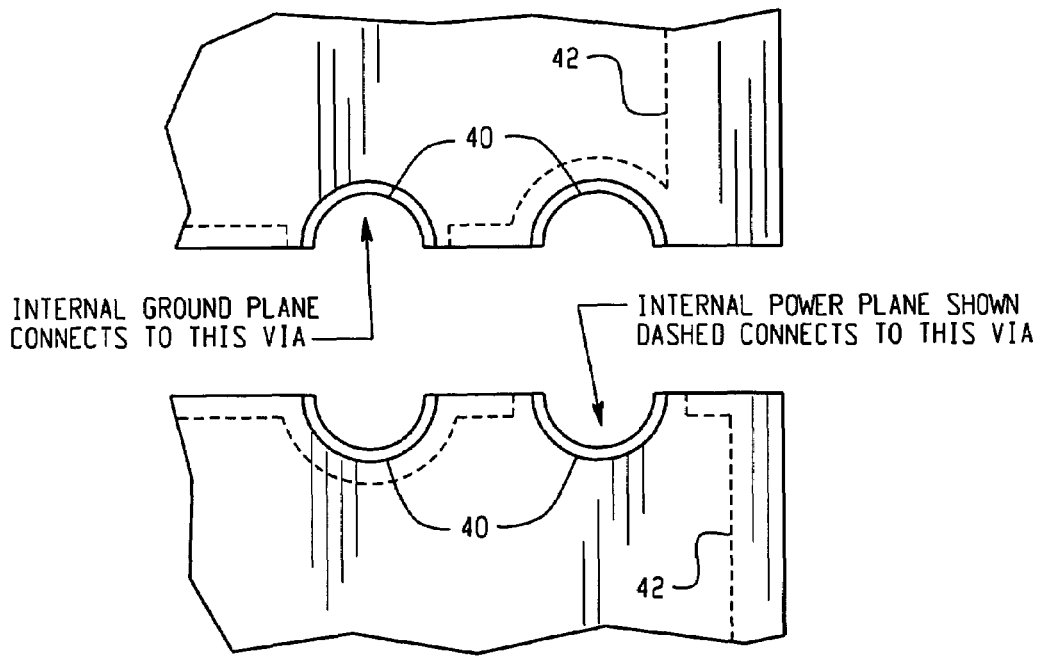

With reference to FIGS. 7A and 7B, a suitable high volume production technique is illustrated for the subassemblies 26. The subassemblies may be produced from a single panel 70. The individual subassemblies 26 are separated by edge regions 72, in which are formed the plated through holes 74. Processes for forming plated through holes in a PCB are well known and need not be described herein. The size of the holes 74 is exaggerated in FIG. 7A simply for ease in understanding. As best illustrated in FIG. 7B, if the edge region 72 is cut down the longitudinal middle, then along the edges of each subassembly 26 after cutting will be open and plated half vias 40. The connected metal layers 42 again are represented by dashed lines. The panel 70 is made with the desired metal layers applied as required for the particular PCA being made, and thus all the subassemblies 26 on the panel 70 may be the same or may be different from each other.

The controlled impedance concept may be realized with many different techniques available to the designer due to the overall concept of the present invention. The impedance can be determined and controlled by appropriate selection of the number of subassemblies used, the layout of the various metal layers that form the power and reference planes, the use of discrete components either externally or interiorly mounted, the size, number and spacing of the contact arrays, whether the metal layers are internal to a subassembly, on a surface or both.

Moreover, the invention provides a power connector design that can be easily reconfigured without excessive tooling changes. For example, the power density may be increased by adding more subassemblies in the stack, or simply increasing the footprint size of the subassemblies. The connectors can be simply an array of contacts held in a connector body that has the same spacing and layout of the vias for the PCA. Different mating heights can be accommodated by changing the layout of the circuit board or boards used for the subassemblies.

The invention has been described with reference to the preferred embodiments. Modifications and alterations will occur to others upon a reading and understanding of this specification and drawings. The invention is intended to include all such modifications and alterations insofar as they come within the scope of the appended claims or the equivalents thereof.

I claim:

1. A power connector assembly, comprising: at least two generally planar boards joined together, each said board having first and second opposite facing surfaces, said at least two boards being parallel stacked with a planar surface of one board joined to a planar surface of an adjacent board, each said board having at least a first conductive layer as a power plane and a second conductive layer as a return plane, a first connector and a second connector that with said at least two planar boards are joined and form a single integral unit, each said connector comprising a respective contact array electrically connected to said first and second conductive layers, said first connector being joinable to a corresponding connector of a first circuit and said second connector being joinable to a connector of a second circuit so that when the power connector assembly is mated with the first and second circuits, power and return connections are made between the first and second circuits through the power connector assembly.

2. The assembly of claim 1 wherein each said board comprises a printed circuit board.

3. The assembly of claim 1 wherein one or more of said boards comprises at least two conductive layers.

4. The assembly of claim 1 comprising insulating layers between adjacent boards.

5. The assembly of claim 1 comprising one or more discrete components disposed within said stack or on exterior surfaces of said stack for controlling impedance.

6. The assembly of claim 1 wherein a contact array is electrically connected to said at least one conductive layer with a via that is electrically connected to said layer, said at least one contact array being connected to said via by soldered ball or soldered pin connections.

7. The assembly of claim 1 comprising at least three boards in said stack and wherein said conductive layers are interleaved.

8. The assembly of claim 1 wherein the power connector assembly consists of power and return connections but not signal connections between the first and second circuits.

9. The assembly of claim 2 wherein each said at least one conductive layer comprises a metal layer that is disposed on or within its respective board.

10. The assembly of claim 6 wherein said via is formed along an edge of one or both said boards.

11. The assembly of claim 9 wherein at least one said connector joins a contact array to one or more vias formed along an edge of one or more of said boards, said one or more vias being selectively in electrical contact with said at least one conductive layer.

12. A power connector assembly, comprising:
a plurality of printed circuit boards joined to each other in a parallel stack, each printed circuit board having at least a first conductive layer as a power plane and a second conductive layer as a return plane so that the power connector assembly has at least one power plane and at least one return plane therein, at least first and second connectors with each said connector having a respective contact array that is electrically connected to a respective one or more of said conductive layers, said first and second connectors and printed circuit boards being joined together as a single integral unit, said first connector being joinable to a corresponding connector of a first circuit and said second connector being joinable to a connector of a second circuit so that when the power connector assembly is mated with the first and second circuit, one or both of power and return connections are made between the first and second circuits through the power connector assembly.

13. The assembly of claim 12 wherein said conductive layers are interior or surface layers of the printed circuit board.

14. The assembly of claim 12 wherein said contact array comprises one or more connector pins.

15. The assembly of claim 12 wherein each said contact array is electrically connected to a via associated with one or more of said conductive layers.

16. The assembly of claim 13 wherein at least one of said printed circuit boards has at least two separate conductive layers associated therewith.

17. The assembly of claim 16 comprising two conductive layers and wherein at least one of said connectors comprises a first contact array connected to a first of said conductive layers and a second contact array connected to a second of said conductive layers.

* * * * *